United States Patent [19]

Baylac et al.

[11] 3,968,447

[45] July 6, 1976

[54] METHOD OF AMPLITUDE-FREQUENCY CONVERSION AND A CONVERTER WHICH OPERATES IN ACCORDANCE WITH SAID METHOD

[75] Inventors: Bernard Baylac, Sassenage; Robert Poujois, Grenoble; Jacques Ripert, Saint-Martin-d'Heres, all of France

[73] Assignee: Commissariat a l'Energie Atomique, Paris, France

[22] Filed: Dec. 13, 1973

[21] Appl. No.: 424,202

[30] Foreign Application Priority Data

Dec. 29, 1972 France .............................. 72.47081

[52] U.S. Cl. ........................ 328/151; 307/235 J; 307/271; 321/2; 328/127
[51] Int. Cl.[2] .................... H03K 1/16; H03K 3/72
[58] Field of Search .......... 328/127, 128, 150, 151, 328/117; 307/228, 235 R, 271; 321/2

[56] References Cited
UNITED STATES PATENTS

| | | |
|---|---|---|
| 3,419,784 | 12/1968 | Winn .............................. 328/127 X |
| 3,560,864 | 2/1971 | Nihof .............................. 328/127 X |
| 3,720,846 | 3/1973 | Borer .............................. 328/127 UX |

*Primary Examiner*—John Zazworsky
*Attorney, Agent, or Firm*—Lane, Aitken, Dunner & Ziems

[57] ABSTRACT

The amplitude of an electrical signal is converted into a current of proportional intensity which is integrated and an integration voltage appears at the terminals of the integrating circuit. There is produced a signal which initiates stopping of the current integration and a signal which initiates the start of a following integration at the instant when the integration voltage attains a threshold value $V_0$. Stopping of the integration occurs after a time-delay $\theta$, when the integration voltage has overstepped the threshold value $V_0$ and attained a maximum value $V'_0$. The threshold value $V_0$ is adjusted so as to control the maximum value $V'_0$ in dependence on a reference voltage $V''_0$ which is higher than $V_0$. The frequency of integrations is measured, with the result that the conversion frequency is thus determined.

12 Claims, 6 Drawing Figures

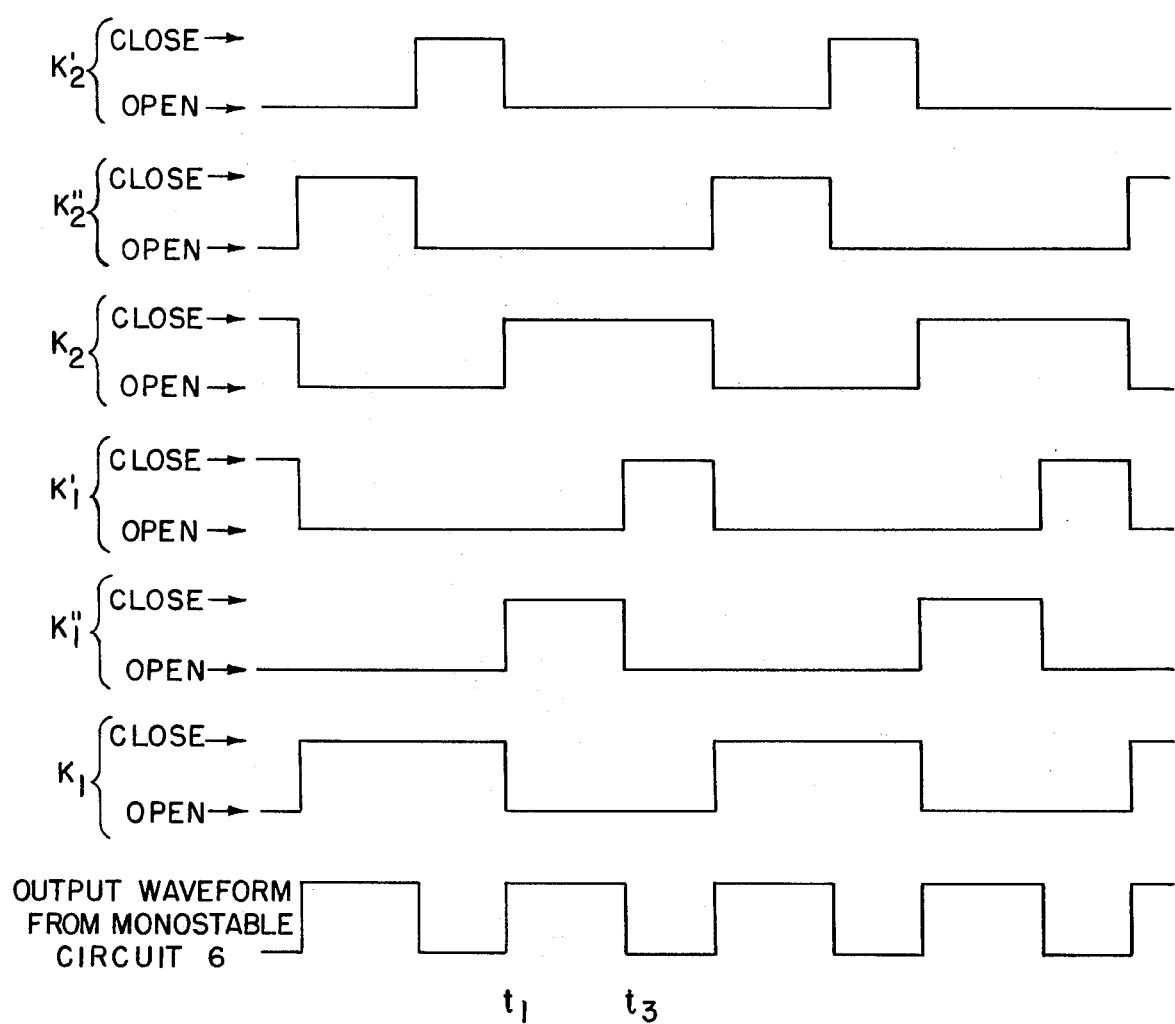

3,968,447

METHOD OF AMPLITUDE-FREQUENCY CONVERSION AND A CONVERTER WHICH OPERATES IN ACCORDANCE WITH SAID METHOD

This invention is concerned with a method for converting into a frequency an electrical signal, a voltage or a current, for example, and with a converter which operates in accordance with said method. The invention finds an application in the field of electronics.

In known methods of amplitude-frequency conversion or so-called direct methods, said amplitude is converted into a proportional current and a series of elementary integrations of said current is performed up to a limiting value determined by the threshold voltage of a threshold circuit. The reversal of state of said circuit serves to produce a stop signal for the corresponding integration and a start signal for the following integration. The frequency of reversal of said threshold circuit represents the result of the conversion of the input voltage.

In this known method and in the corresponding converters, the maximum voltage really attained is higher than the threshold voltage since the time of generation of the stop signals is necessarily non-zero. This results in an error which is even greater as on the one hand the time of reversal of the threshold circuit and the time of generation of the signals in the control circuit are of longer duration and as on the other hand the integration voltage has a higher gradient. This shortcoming could be offset in the case of circuits having known and stable characteristics at all frequencies but such circuits do not exist and their varying degrees of drift are in any case not eliminated by so doing. Moreover, this correction is not valid in the case of all voltages to be converted.

The precise object of the invention is to provide a method and a device which make it possible to compensate for the above-mentioned error by controlling the maximum value really attained by the integration voltage in dependence on a reference value, this being achieved by producing action on the threshold voltage which defines the instant of reversal of the threshold circuit.

More specifically, the present invention is directed to a method for converting the amplitude of an electrical signal into a frequency in which:
said amplitude is converted into a current of proportional intensity,
said current is integrated in an integrating circuit and an integration voltage is developed at the terminals of said circuit,
there is produced a signal for initiating the stopping of said current integration and a signal for initiating the start of a following integration at the instant when the integration voltage attains a threshold value $V_0$, actual stopping of the integration being intended to take place only after a time-delay $\theta$ whilst the integration voltage exceeds the value $V_0$ and attains a maximum value $V'_0$,
characterized in that:
the threshold voltage $V_0$ is adjusted so as to ensure that said maximum value $V'_0$ is controlled in dependence on a reference voltage $V''_0$ which is higher than $V_0$,
the frequency with which the sequence of integrations aforesaid take place is measured and this gives the desired conversion frequency.

The integration-voltage control can be carried out by determining the integration-voltage overshoot with respect to $V''_0$ either by measuring the maximum value attained by the integration voltage or by measuring the mean value of said integration voltage.

The invention is also directed to a voltage-frequency converter which comprises:
an amplitude-current conversion circuit which receives the signal to be converted,
an integrating circuit which is provided with resetting means and receives said current, an integration voltage being developed at the terminals of said circuit,
a switching circuit which connects the integrating circuit to said conversion circuit and the open and closed states of which define the stopping and starting of the integrations,
a bistable threshold circuit which receives said integration voltage and is adjusted so as to begin to change state when it receives an integration voltage equal to a threshold voltage having the value $V_0$,
a logic circuit for forming control signals and synchronized with the reversal-of-state action of said threshold circuit, said logic circuit being intended to deliver control signals for said switching circuit and control signals for said resetting means,
a circuit for measuring the frequency of reversal of said bistable circuit, which gives said conversion frequency,
said converter being characterized in that it further comprises:
a source of voltage having a reference value $V''_0$,
a circuit for controlling in dependence on said reference value $V''_0$ the maximum integration voltage $V'_0$ which is really attained at the instant of stopping of an integration, the output of said integration-voltage control circuit being intended to deliver said threshold voltage $V_0$ and being connected to said bistable threshold circuit.

In a first embodiment, the converter comprises a circuit which serves to measure the maximum value attained by the integration voltage at the end of each elementary integration, to permit determination of voltage overshoots and consequently to correct the threshold voltage. Said measuring circuit advantageously contains a storage circuit. In a second embodiment, the converter comprises a circuit for measuring the mean value of the integration voltage.

The properties and advantages of the invention will in any case become more readily apparent from the following description of exemplified embodiments which are given by way of explanation but not in any limiting sense, reference being made to the accompanying drawings, wherein:

FIGS. 4 and 4a are diagrams illustrating the operation of the circuit of FIG. 3;

Figure 1:
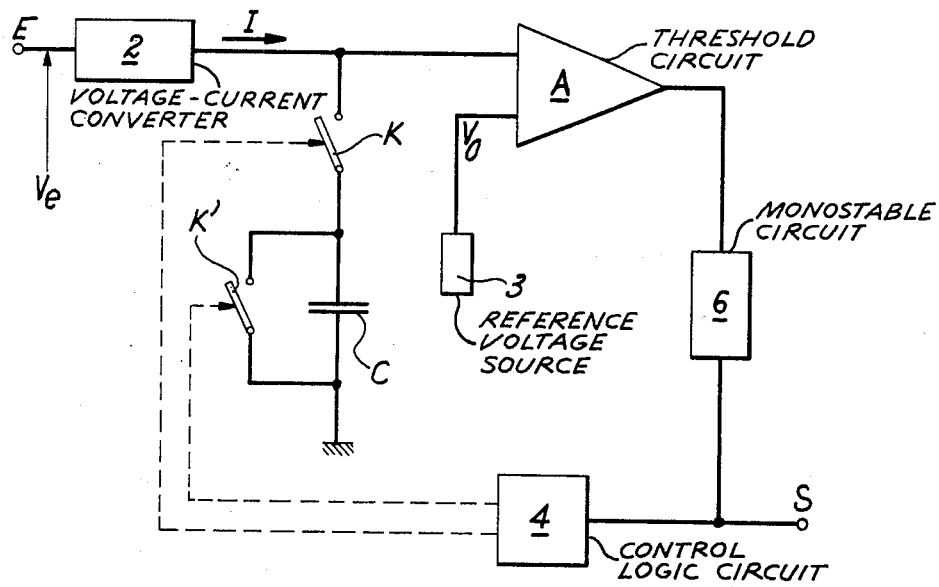
FIG. 1 is a schematic diagram of a voltage-frequency converter of the prior art.

There is shown in FIG. 1 a diagram of a voltage-frequency converter in accordance with the prior art. This converter comprises a voltage-current converter 2 which receives the input voltage $V_e$ on the input terminal E and delivers a proportional current I. Said current is integrated in a capacitor C which is connected to the output of the converter 2 through a switch K, a switch K' being placed in parallel with the capacitor C. The integration voltage of the capacitor C is compared in a threshold circuit A with a reference voltage $V_0$ supplied by a source 3. The change of state of said circuit is turned to useful account for the purpose of generating in the control logic circuit 4 the signals for controlling the switches K and K'. A monostable circuit 6 connected to the threshold circuit A generates pulses at each reversal of said circuit and delivers at the output S of the converter a series of pulses having a frequency which represents the result of conversion of the input voltage $V_e$.

Instead of employing a single capacitor C, it is possible in accordance with known practice to make use of a plurality of capacitors in parallel, for example two capacitors, the integration of the current being performed in one capacitor and then in the other in alternate sequence.

Figure 2:
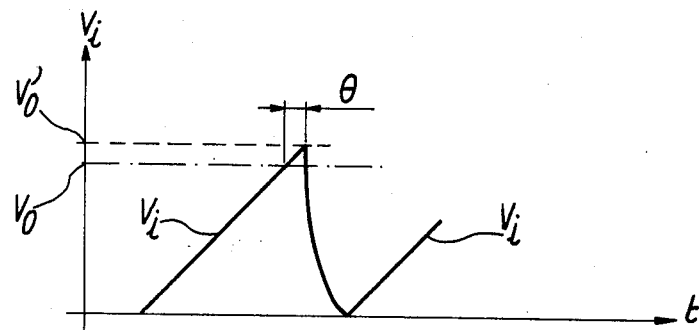
FIG. 2 is a diagram which illustrates the threshold overshoot or excursion of the integration voltage beyond the threshold.
Figure 4:
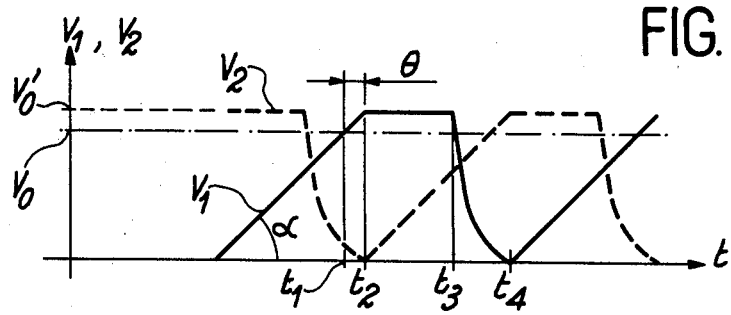

The operation of the converter of FIG. 1 is illustrated in FIG. 2. The time-dependent variation of the integration voltage $V_i$ has been plotted in this figure. This voltage has a sawtooth shape which is characteristic of the linear charge of the capacitor C. When the integration voltage exceeds the value $V_0$ of the voltage $\Delta V_0$ which is necessary for a reversal of state, a capacitor-discharge control signal is generated in the circuit 4. Since the response of the circuit A is not infinitely fast and the time of generation of the control signal is not zero, this results in a further time-delay. A total time-delay $\theta$ takes place prior to stopping of the integration, with the result that the integration voltage $V_i$ exceeds the threshold voltage $V_0$ and attains a value $V'_0$; this maximum value is a function of the slope of the integration ramp and of the total time-delay $\theta$. The slope of the integration ramp is represented mathematically as $\tan \alpha$ wherein $\alpha$, as shown in FIG. 4, is the angle that the integration ramp curve $V_1$ or $V_2$ makes with the time axis.

In accordance with the invention, in order to cancel the errors due to threshold overshoot by the integration voltage, said overshoot is measured and a corrected threshold voltage is formed in order that the integration voltage should attain the desired reference value, taking into account the time-delay $\theta$ and the slope of the sawtooth.

Figure 3:
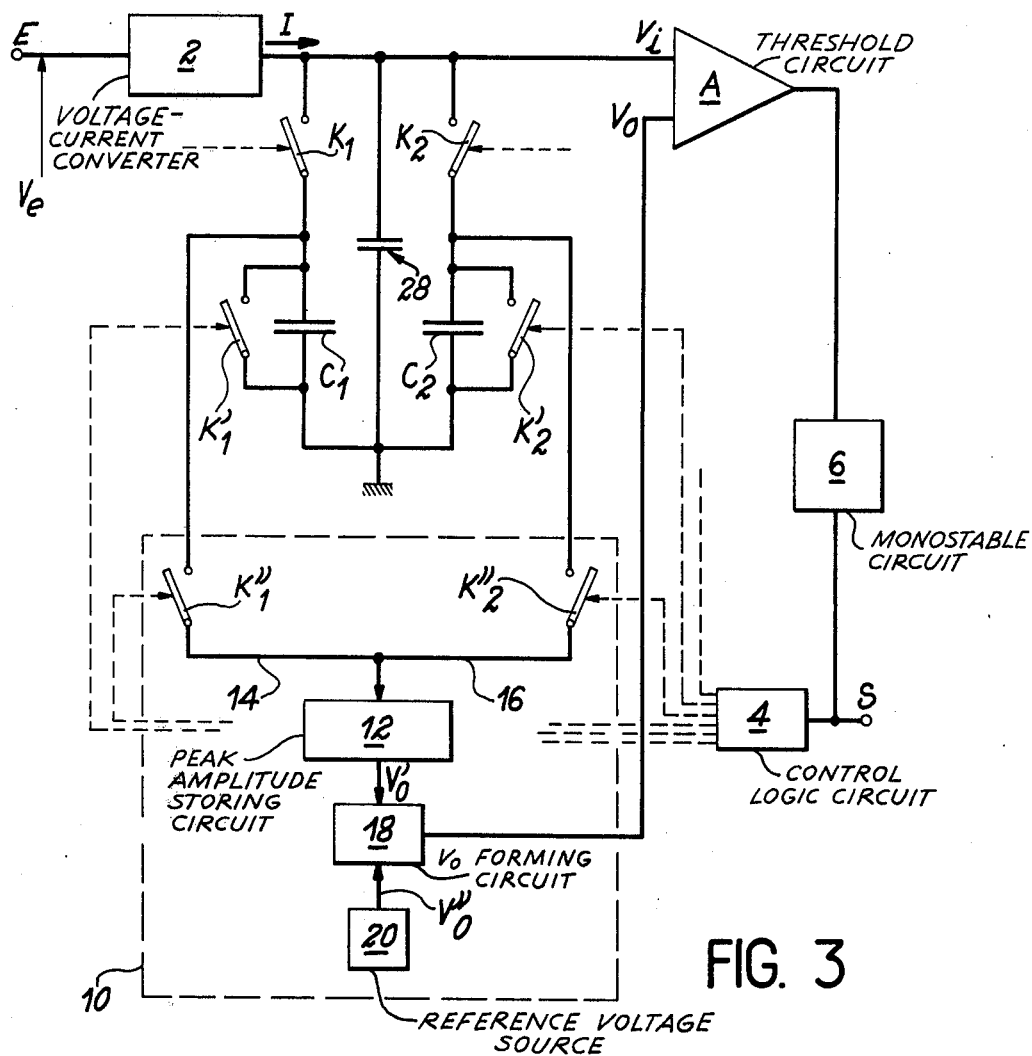
FIG. 3 shows a diagram of a first alternative embodiment of a voltage-frequency converter in accordance with the invention in which use is made of a storage circuit so as to permit integration-voltage control by measuring the peak value of the integration voltage.

By way of explanation, two alternative embodiments which serve to carry out this integration-voltage control will now be described. In FIG. 3, there is shown a diagram of one particular form of construction of a voltage-frequency converter which entails the use of a circuit for storing the peak amplitude attained by the integration voltage. This diagram corresponds to the case in which the voltage-frequency converter is constituted by an integrating circuit comprising at least two capacitors $C_1$ and $C_2$ associated with charge and discharge switches $K_1/K'_1$ and $K_2/K'_2$. In addition to this circuit, there are again shown in FIG. 3 the sub-assemblies which have already been mentioned with reference to FIG. 1, namely the voltage-current converter 2, the control logic circuit 4, the monostable circuit 6 and the threshold circuit A which receives the threshold voltage $V_0$ and the integration voltage $V_i$. The integration-voltage control circuit is designated by the reference 10 and comprises a circuit 12 for storing the peak amplitude attained by the integration voltage; said circuit 10 is connected to the integration capacitors $C_1$ and $C_2$ through the leads 14 and 16 and through switches $K''_1$ and $K''_2$. A circuit 18 for forming the corrected threshold voltage $V_0$ receives: the voltage $V'_0$ which is stored in the circuit 12, the so-called reference voltage $V''_0$ which is supplied from an auxiliary source 20.

If so required, the circuit can comprise more than two storage capacitors but may also have one capacitor alone.

The operation of said circuit is illustrated in the diagrams of FIGS. 4 and 4a. FIG. 4 shows the time-dependent variations of the integration voltages $V_1$ and $V_2$ at the terminals of the capacitors $C_1$ and $C_2$. The voltage $V_1$ increases linearly to the value $V''_0 = V_0 + \Delta V_0$. Said voltage attains $V_0$ at the instant $t_1$. This instant corresponds to the beginning of generation of a stop signal for the integration in the capacitor $C_1$; stopping actually occurs only after a time-interval $\theta$. The voltage $V_1$ therefore oversteps the threshold voltage $V_0$ and attains the maximum voltage $V'_0$ at the instant $t_2$. At this time, threshold circuit A will trigger the monostable circuit 6 and cause it to generate a pulse. In response to this pulse, the control logic circuit 4 generates on the one hand the signal for opening the switch $K_1$ which results in the end of integration in the capacitor $C_1$ and initiates on the other hand the closure of the switch $K''_1$ which makes it possible to store the peak voltage of integration in the storage circuit 12. During this storage stage, the discharge switch $K'_1$ remains open, with the result that the integration voltage $V_1$ retains its maximum value throughout the steady level having a time-duration $t_3 - t_2$. At the instant $t_3$, the control logic circuit 4 delivers a signal for opening the switch $K''_1$ and closing the switch $K'_1$, thus initiating the discharge of the capacitor $C_1$. Since the integration of the current I in the capacitor $C_1$ has stopped from the instant $t_2$, the control logic circuit 4 delivers a signal for closing the switch $K_2$ at this instant in order that the integration should be continued in the capacitor $C_2$. The stages of linear integration, storage in the circuit 12 and then discharge are repeated in the same manner in the case of the capacitor $C_2$.

FIG. 4a is a timing diagram showing when the opening and closing of the switches $K_1$, $K'_1$, $K''_1$, $K_2$, $K'_2$ and $K''_2$ are initiated relative to the output of the monostable multivibrator 6. As shown in FIG. 4a, the output of the monostable multivibrator 6, which is triggered by the threshold circuit A, is a rectangular waveform. In response to this waveform, the logic circuit 4 initiates the opening and closing of each of the switches $K_1$, $K'_1$, $K''_1$, $K_2$, $K'_2$ and $K''_2$ at the time shown in FIG. 4a. For example, at time $t_1$, the monostable circuit will generate a pulse and in response thereto, the logic circuit 4 will initiate the opening of the switch $K_1$ and the closing of the switch $K''_1$ and $K_2$. Then at time $t_3$, the logic curcuit 4 will open switch $K_1''$ and close switch $K_1'$. When the threshold circuit A next triggers the monostable multivibrator 6 to produce the next pulse, the logic circuit 4 will open switch $K_2$ and close the switch $K_1$. At this time, $K_1'$ must also be opened so that the capacitor $C_1$ will begin to charge. Also at this time, switch $K_2''$ will cose. Then after a time interval corresponding to the interval of time from time $t_1$ to time $t_3$, the switch $K_2''$ will be opened and the switch $K_2'$ will be closed. Then in response to the next pulse on the monostable circuit, the switch $K_1$ will be opened again and the cycle will repeat.

The voltages $V'_0$ and $V''_0$ are therefore applied to the circuit 18 which produces on the basis of these values a changeover threshold voltage $V_0$ which is such that the maximum voltage attained is equal to the reference voltage $V''_0$.

It can readily be understood that if, for example, $\alpha$, $\theta$, and $V''_0$ are known, $V_0$ must be adjusted to the value:

$$V_0 = V''_0 - \theta \tan \alpha$$

The value of $\tan \alpha$ can be determined in the circuit 18 by means of known circuits which serve to measure, for example, the amplitude of the input voltage $V_e$ (through the lead 22) or the derivative of the current I.

The storage device 12 can be replaced by a peak-voltage measuring circuit without thereby departing from the scope of the invention.

As has already been mentioned, the integrating circuit which is constituted by the two capacitors $C_1$ and $C_2$ can be replaced by any other known circuit of the same type. However, it can be an advantage to incorporate with this known circuit an additional capacitor which is connected in parallel as designated by the reference 28 in FIG. 3. A capacitor of this type is permanently connected to the converter 2 and has a function similar to that of a buffer capacitor which always takes the current I into account, even during the short instants of switching in the vicinity of the instants $t_2$, $t_4$ and so forth.

When a switch such as $K_1$ or $K_2$ closes and initiates a further integration, the charges accumulated in the capacitor 28 are distributed within the corresponding integration capacitor. This advantageous arrangement prevents conversion errors even in the event of imperfect synchronism in the control of the switches $K_1$ and $K_2$.

Figure 5:
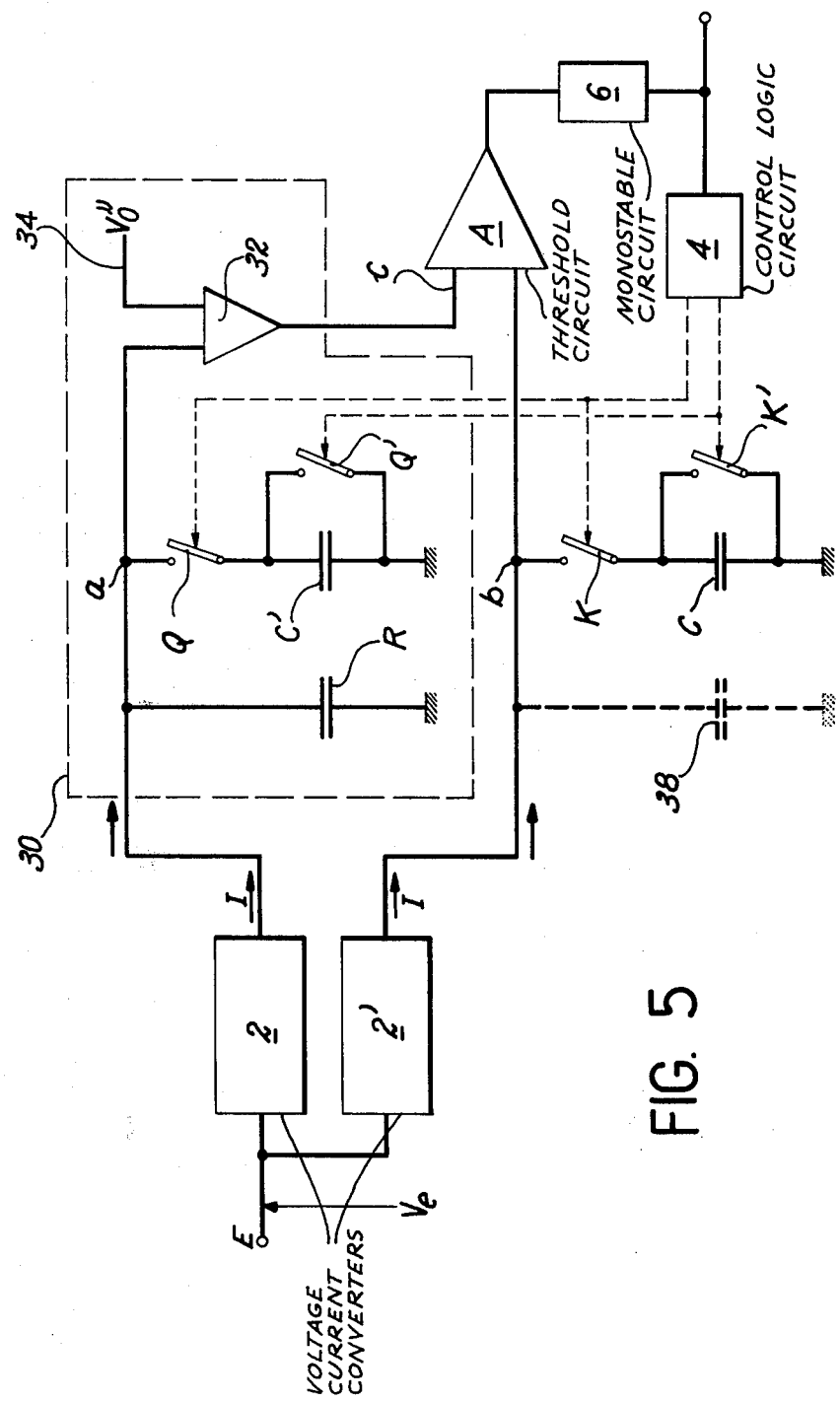
FIG. 5 is a schematic diagram showing a second alternative embodiment of a voltage-frequency converter according to the invention in which use is made of an auxiliary integrating circuit so as to permit integration-voltage control by measuring the mean value of the integration voltage.

In the second embodiment of a voltage-frequency converter in accordance with the invention as shown in FIG. 5, there is employed an auxiliary integrating circuit which makes it possible to measure the mean value of the integration voltage. There are shown in this diagram two voltage-current converters 2 and $2^l$ which receive the input voltage $V_e$ as applied to the input terminal E and a main integrating circuit constituted by a capacitor C associated with a charge switch K and a discharge switch $K'$, a threshold circuit A, a monostable device 6 and a control logic circuit 4. This converter additionally comprises an auxiliary integrating circuit 30 connected in parallel with the main integrating circuit and comprising: a capacitor R having a value which is P times greater than that of the capacitor C, a capacitor $C'$ having the same value as C, charge and discharge switches Q and $Q'$ respectively which are controlled by the logic circuit 4; the auxiliary integrating circuit 30 further comprises an amplifier 32 having a gain $-P$ which receives the voltage read at the point $a$ and a reference voltage $V''_0$ which appears on the lead 34. The output $c$ of the amplifier 32 delivers a threshold voltage $V_0$ and the integration voltage of the main circuit as collected at the point $b$ is compared with said threshold voltage.

The operation of this circuit is as follows: the sawtooth waveforms which appear at $a$ and result from the successive charges and discharges of the capacitor $C'$ have an amplitude which is P times smaller than those which appear at $b$. As a result of the action of the amplifier 32 having a gain $-P$, there again appear at $c$ the sawtooth waveforms which have the same amplitude as at the point $b$ but are reversed. At high frequencies, the amplifier 32 no longer follows the signal detected at $a$ and the voltage appearing on the output $c$ assumes a lower mean value than would be the case without this regulation, which is the image of the peak voltage appearing at the terminals of the capacitor C when the control logic circuit comes into action in order to open the switch K; this corresponds to a reduction of the threshold voltage which compensates for the time-delay $\theta$. In other words, the auxiliary circuit 30 recopies the state of the main circuit and the amplifier 32 is the high-frequency equivalent of an integrating circuit which supplies the peak value of the integration voltage.

In this circuit arrangement, a peak voltage is generated and employed for the integration-voltage control. In other arrangements, it would be possible to produce a mean voltage instead of a peak voltage, which amounts to the same thing except for one factor if the shape of the signal remains substantially the same.

The principle of measurement of the mean value by the circuit described in the foregoing is based on the fact that the amplifier 32 does not follow the rapid variations of its input voltage at high frequency. At low frequency, said circuit operates in a different manner and no longer ensures the desired integration-voltage control but has another property which is as follows: at low frequency, the output $c$ of the amplifier 32 follows the progressive variations of the input voltage at $a$ and the voltage at $c$ is equal and opposite to the voltage at $b$. The amplifier A then operates in push-pull and the sensitivity to reversals of state is double.

In the circuit arrangement of FIG. 5, a buffer capacitor 38 may if necessary be connected continuously in parallel with the integration capacitor C in order to store that part of the current I which is intended to be integrated in said circuit during the periods of discharge of the capacitor C in accordance with the arrangement described earlier in connection with the capacitor 28 of FIG. 3.

What we claim is:

1. A method for converting the amplitude of an electrical signal into a frequency in which:
    said amplitude is converted into a current of proportional intensity,
    said current is integrated in an integrating circuit and an integration voltage is developed at the terminals of said circuit,
    there is produced a signal for initiating the stopping of said current integration and a signal for initiating the start of a following integration at the instant when the integration voltage attains a threshold value $V_0$, actual stopping of the integration being intended to take place only after a time-delay $\theta$ whilst the integration voltage exceeds the value $V_0$ and attains a maximum value $V'_0$, wherein:
the threshold voltage $V_0$ is adjusted so as to ensure that said maximum value $V'_0$ is controlled in dependence on a reference voltage $V''_0$ which is higher than $V_0$.

2. A method according to claim 1 wherein, in order to adjust said threshold voltage, the value of the voltage $V'_0$ attained by the integration voltage is measured and $V'_0$ is compared with the reference voltage $V''_0$.

3. A method according to claim 2 wherein, in order to measure the maximum value $V'_0$ attained by the integration voltage, said maximum value is stored and the stored value is measured.

4. A method according to claim 1 wherein, in order to adjust said threshold voltage, the mean value of the integration voltage is measured and compared with said reference value $V''_0$.

5. An amplitude-frequency coverter which comprises:
an amplitude-current conversion circuit which receives the signal to the converted,
an integrating circuit which is provided with resetting means and which receives said current and developes an integration voltage corresponding to the integral of said current,
a switching circuit connecting the integrating circuit to said conversion circuit and having open and closed states which define the stopping and starting of the integrations,
a bistable threshold circuit which receives said integration voltage and is adjusted so as to begin to change state when it receives an integration voltage equal to a threshold voltage having the value $V_0$,
a logic circuit for forming control signals and synchronized with the reversal-of-state action of said threshold circuit, said logic circuit being intended to deliver control signals for said switching circuit and control signals for said resetting means,
wherein said converter further comprises:
a source of voltage having a reference value $V''_0$,
a circuit for controlling in dependence on said reference value $V''_0$ the maximum integration voltage $V'_0$ which is really attained at the instant of stopping of an integration, the output of said integration-voltage control circuit being intended to deliver said threshold voltage $V_0$ and being connected to said bistable threshold circuit.

6. An amplitude-frequency converter according to claim 5, wherein said converter comprises a circuit which serves to measure the maximum value attained by the integration voltage at the end of each integration and is connnected to said voltage-control circuit, a circuit for producing the threshold voltage $V_0$ whose inputs are connected to said measuring circuit, to said source and whose output is connected to one input of said threshold circuit.

7. An amplitude-frequency converter according to claim 6, wherein the circuit for measuring the maximum value attained by the integration voltage comprises a circuit for the storage of said maximum value.

8. An amplitude-frequency converter according to claim 5, wherein said converter comprises a circuit which serves to measure the mean value of the integration voltage and is connected to said voltage-control circuit.

9. An amplitude-frequency converter according to claim 5, wherein one input of said voltage-control circuit is connected to the input of the amplitude-frequency converter.

10. An amplitude-frequency converter according to claim 5, wherein said voltage-control circuit is constituted by an auxiliary integrating circuit connected through a switching circuit to a second amplitude-current conversion circuit which receives the signal to be converted, said auxiliary integrating circuit being provided with resetting means, said means as well as said switching circuit being controlled in synchronism with said means and switching circuit of the main integrating circuit, and by a two-input amplifier which operates as an integrator in the case of the frequency at which the sequence of integrations takes place, the voltage which appears at the terminals of said auxiliary integrating circuit and said reference voltage $V''_0$ being applied to the inputs of said amplifier.

11. An amplitude-frequency converter according to claim 5, wherein the integrating circuit is constituted by a capacitor C and wherein said voltage-control circuit is constituted by an auxiliary integrating circuit connected through a switching circuit to a second amplitude-current conversion circuit for receiving the signal to be converted, said auxiliary integrating circuit being such as to comprise a capacitor having a value C with a capacitor C' having a value equal to that of C in conjunction with parallel-connected resetting means and a capacitor R having a value P times greater than the value of the capacitor C and connected in parallel with the assembly consisting of the switching circuit and capacitor C', said means for resetting the capacitor C' as well as the switching circuit of the auxiliary circuit being controlled in synchronism with said means for resetting the capacitor C and said switching circuit of the main integrating circuit, and by a two-input amplifier having a gain of $-P$ which operates as an integrator in the case of the frequency at which the sequence of integrations takes place, the voltage appearing at terminals of said capacitor C' and said reference voltage $V''_0$ being applied to the inputs of said amplifier.

12. An amplitude-frequency converter according to claim 5, wherein a buffer capacitor is continuously connected in parallel with said integrating circuit.

* * * * *